(12) United States Patent
Matsumoto

(10) Patent No.: US 7,464,702 B2
(45) Date of Patent: Dec. 16, 2008

(54) METHOD OF PRODUCING III-NITRIDE SUBSTRATE

(75) Inventor: Naoki Matsumoto, Itami (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 11/646,397

(22) Filed: Dec. 28, 2006

(65) Prior Publication Data

US 2007/0105485 A1 May 10, 2007

Related U.S. Application Data

(60) Division of application No. 11/486,216, filed on Jul. 14, 2006, now Pat. No. 7,223,155, which is a continuation of application No. PCT/JP2005/023918, filed on Dec. 27, 2005.

(30) Foreign Application Priority Data

Jan. 7, 2005 (JP) ............................. 2005-002970

(51) Int. Cl.
*B28D 1/00* (2006.01)
(52) U.S. Cl. ......................... 125/21; 438/481
(58) Field of Classification Search ................ None
See application file for complete search history.

(56) References Cited

U.S. PATENT DOCUMENTS

| 4,274,389 | A | * | 6/1981 | White et al. | .................. 125/21 |
| 5,699,782 | A | * | 12/1997 | Toyama | ........................ 125/21 |
| 6,139,591 | A | | 10/2000 | Nakaura et al. | |
| 6,413,627 | B1 | | 7/2002 | Motoki et al. | |
| 7,045,223 | B2 | * | 5/2006 | Kokta et al. | .................. 428/702 |
| 7,048,867 | B2 | * | 5/2006 | Maleville | ...................... 216/20 |
| 7,112,826 | B2 | * | 9/2006 | Motoki et al. | ................ 257/103 |
| 2002/0014681 | A1 | * | 2/2002 | Tsuda et al. | ................. 257/618 |
| 2002/0028564 | A1 | | 3/2002 | Motoki et al. | |
| 2004/0089919 | A1 | * | 5/2004 | Motoki et al. | ................ 257/613 |
| 2005/0224783 | A1 | * | 10/2005 | Matsuyama et al. | ........... 257/14 |

FOREIGN PATENT DOCUMENTS

| JP | 9-17755 A | 1/1997 |
| JP | 2842307 | 10/1998 |

(Continued)

OTHER PUBLICATIONS

Notification of Transmittal of Copies of Translation of the International Preliminary Report on Patentability (Chapter I or Chapter II of the Patent Cooperation Treaty) dated Jul. 19, 2007, issued in PCT/JP2005/023918.

*Primary Examiner*—Maurina Rachuba
(74) *Attorney, Agent, or Firm*—McDermott Will & Emery LLP

(57) ABSTRACT

An ingot 3 of a hexagonal III-nitride crystal is cut using a wire array 21 composed of a wire 22. On this occasion, the ingot 3 is cut in such a manner that the ingot 3 is sliced with supply of an abrasive fluid while feeding at least one of the ingot 3 and wire 22 in a direction perpendicular to an extending direction B of the wire 22. During cutting the ingot 3, the extending direction B of the wire 22 is inclined at 3° or more to the {1-100} plane of the ingot 3.

3 Claims, 9 Drawing Sheets

FOREIGN PATENT DOCUMENTS

| | | |
|---|---|---|
| JP | 11-251269 A | 9/1999 |
| JP | 2000-22212 A | 1/2000 |
| JP | 2001-1335 A | 1/2001 |
| JP | 2002-29897 A | 1/2002 |
| JP | 2002-46067 A | 2/2002 |
| JP | 2003-527296 A | 9/2003 |
| JP | 2003-320521 A | 11/2003 |
| WO | WO 01/68955 A1 | 9/2001 |

* cited by examiner

Fig.5

| INCLINATION ANGLE OF WIRE RUNNING DIRECTION TO (1-100) PLANE | CRYSTAL PLANE PARALLEL TO WIRE RUNNING DIRECTION | EFECTIVE DUE TO OCCURRENCE OF CRACKS | NOTE |
|---|---|---|---|
| 0° | (1-100) | 30% | CLEAVAGE PLANE (HIGH CLEAVAGE)·IF |
| 3° | · | 15% | — |
| 15° | · | 3% | — |
| 27° | · | 7% | — |
| 30° | · | 10% | CLEAVAGE PLANE (LOW CLEAVAGE)· EQUIVALENT PLANE TO (11-20) |
| 33° | · | 8% | — |
| 45° | · | 3% | — |
| 57° | · | 12% | — |
| 60° | · | 20% | CLEAVAGE PLANE (HIGH CLEAVAGE)· EQUIVALENT PLANE TO (1-100) |
| 63° | · | 15% | — |
| 75° | · | 3% | — |
| 87° | · | 7% | — |
| 90° | (11-20) | 11% | CLEAVAGE PLANE (LOW CLEAVAGE)·OF |

Fig.6

| ABRASIVE CONCENTRATION | BOW | CRACKS | NOTE | JUDGMENT |
|---|---|---|---|---|
| 50ct/L (10g/L) | 80μm | CRACKS OBSERVED IN SOME SUBSTRATES | SAW MARK OBSERVED | NG |
| 200ct/L (40g/L) | 50μm | NO CRACK OBSERVED | | OK |
| 400ct/L (80g/L) | 45μm | NO CRACK OBSERVED | | OK |
| 800ct/L (160g/L) | 40μm | NO CRACK OBSERVED | | OK |
| 1200ct/L (240g/L) | 30μm | NO CRACK OBSERVED | | OK |
| 1500ct/L (300g/L) | 30μm | NO CRACK OBSERVED | | OK |
| 2000ct/L (400g/L) | 30μm | NO CRACK OBSERVED | BREAKAGE OF BEARING HEAVY ATTACHMENT OF ABRASIVE FLUID TO EQUIPMENT | NG |

Fig.7

| AVERAGE GRAIN SIZE | BOW | DEPTH OF WORK-ALTERED LAYER | NOTE | JUDGMENT |
|---|---|---|---|---|
| 0.5 μm | 60 μm | 0.5 μm OR LESS | | NG |
| 1 μm | 50 μm | 0.5 μm OR LESS | | OK |
| 3 μm | 45 μm | 1 μm | | OK |
| 6 μm | 30 μm | 2 μm | | OK |
| 15 μm | 40 μm | 6 μm | | OK |
| 20 μm | 50 μm | 12 μm | MICROCRACKS OBSERVED | NG |
| 30 μm | 50 μm | 16 μm | MICROCRACKS OBSERVED | NG |

Fig.8

| FEED SPEED (PER HOUR) | BOW | JUDGMENT |
|---|---|---|
| 0.4 mm | 30 μm | OK |
| 0.8 mm | 30 μm | OK |
| 1.2 mm | 30 μm | OK |
| 1.6 mm | 35 μm | OK |
| 2 mm | 40 μm | OK |
| 2.4 mm | 50 μm | OK |
| 3 mm | 75 μm | NG |

Fig.9

| WIRE DIAMETER | BOW | KERF LOSS | WIRE TENSION | JUDGMENT |
|---|---|---|---|---|
| 0.08mm | 75μm | 120μm | 6 N | NG |
| 0.12mm | 45μm | 160μm | 12 N | OK |
| 0.16mm | 35μm | 200μm | 20 N | OK |
| 0.18mm | 35μm | 240μm | 25 N | OK |
| 0.20mm | 30μm | 280μm | 30 N | OK |
| 0.24mm | 30μm | 320μm | 35 N | NG |

METHOD OF PRODUCING III-NITRIDE SUBSTRATE

RELATED APPLICATION

This application is a divisional of application Ser. No. 11/486,216, filed Jul. 14, 2006 now U.S. Pat. No. 7,223,155, that is based on a continuation of International Application No. PCT/JP2005/023918, filed on Dec. 27, 2005, which in turn claims the benefit of Japanese Application No. 2005-002970, filed on Jan. 7, 2005; which are all incorporated herein by reference.

TECHNICAL FIELD

The present invention relates to a method of producing a III-nitride substrate.

BACKGROUND ART

Production steps of a semiconductor substrate include a step of cutting (or slicing) of an ingot into plates. One of methods for cutting an ingot into plates is to cut an ingot by means of a running wire array (multi-wire saw). For example, Patent Document 1 discloses a method of cutting a silicon ingot by means of a multi-wire saw. Patent Document 2 discloses a method of cutting an ingot of a III-V compound semiconductor such as GaAs, InP, or GaSb by means of the multi-wire saw. Patent Document 3 describes cutting an ingot of a III-nitride such as GaN by means of the multi-wire saw.
Patent Document 1: Japanese Patent Application Laid-Open No. 2001-1335
Patent Document 2: Japanese Patent No. 2842307
Patent Document 3: Published Japanese translation of PCT Application No. 2003-527296

DISCLOSURE OF THE INVENTION

Problem to be Solved by the Invention

However, since it is difficult to produce the III-nitride such as GaN by solution growth, it is difficult to produce a long ingot thereof, such as those of Si and GaAs, and currently available ingot thicknesses of III-nitrides are at most several mm. Therefore, no technology for cutting an ingot into plates has been established yet.

The III-nitrides of GaN and others are harder than the other semiconductor materials such as Si and GaAs (e.g., the Vickers hardness of a single crystal of GaN is approximately 1300 $kg/mm^2$). In addition, the III-nitride crystals generally have a high crystal defect density, $10^5$ defects/$cm^2$ or more (cf. the crystal defect density of GaAs is not more than $10^3$ defects/$cm^2$), and macro defects such as mixture of pits and inclusions are likely to appear during crystal growth. Therefore, cracks (splitting and chipping) are likely to occur in substrates during forming the substrates by cutting the ingot of the III-nitride crystal.

The present invention has been accomplished in view of the above problem and an object of the invention is to provide a production method of a III-nitride substrate capable of reducing a rate of occurrence of cracks during cutting an ingot by means of a running wire array.

Means for Achieving the Object

In order to achieve the above object, a production method of a III-nitride substrate according to the present invention is a method of producing a III-nitride substrate by cutting an ingot of a hexagonal III-nitride crystal, using a wire array, comprising: a step of cutting the ingot with supply of an abrasive fluid, while feeding at least one of the ingot and the wire array in a direction intersecting with an extending direction of each wire in the wire array, wherein during cutting the ingot, the extending direction of each wire in the wire array is inclined at 3° or more to the {1-100} plane of the ingot.

The Inventor performed attempts to cut a III-nitride crystal under a variety of cutting conditions in order to achieve the above object and found that the crack occurrence rate was significantly affected by an angle between the extending direction of the wire and the {1-100} plane which is a cleavage plane easiest to cleave in the III-nitride crystal. Then the Inventor discovered that the crack occurrence rate was drastically reduced by inclining the extending direction of each wire in the wire array at 3° or more to the {1-100} plane of the ingot.

The production method of the III-nitride substrate is preferably arranged as follows: it further comprises a step of forming an orientation flat along the (11-20) plane of the ingot in the ingot, prior to the step of cutting the ingot, and during the step of cutting the ingot, an inclination angle of the extending direction relative to the (11-20) plane of the ingot is set at 27° or less. Since the (11-20) plane of the III-nitride crystal is perpendicular to the (1-100) plane with high cleavage, it is suitable for an orientation flat (hereinafter referred to as OF). The (11-20) plane is inclined at 30° to an equivalent plane to the (1-100) plane. Therefore, when the extending direction of the wire is inclined at the inclination angle of not more than 27° to this (11-20) plane, the extending direction of the wire is inclined at 3° or more to the {1-100} plane, whereby the crack occurrence rate can be drastically reduced.

In addition, the above method provides the following effects. The III-nitride crystal is harder than the other semiconductor crystals, and a nitrogen surface and a III-atom surface opposite thereto are different in such properties as hardness and chemical resistance; therefore, the feed speed during cutting has to be lower than those of the other semiconductor crystals, and the cutting takes some time. The aforementioned method can reduce the time necessary for the cutting because the cutting distance (the exterior diameter in the feed direction of the ingot) becomes shorter by virtue of the OF. When the ingot is so arranged that the OF is located on the cutting start side, a portion of the ingot at a start of the cutting is not a circumferential surface but a plane, which can facilitate alignment of the ingot with the wire array.

The production method of the III-nitride substrate may be arranged as follows: during cutting the ingot, one or more other ingots are arranged in a direction intersecting with the feed direction of the ingot and the other ingots are cut together with the ingot. As described above, the feed speed of the III-nitride crystal during cutting has to be lower than those of the other semiconductor crystals, and the cutting thereof takes some time. On the other hand, when the ingot is cut by means of the multi-wire saw, it is necessary to use a generally expensive abrasive fluid (slurry) containing hard abrasive grains such as diamond, in order to cut the hard III-nitride crystal. In addition, guide rollers for running the wire array wear faster because of the abrasive fluid containing the hard abrasive grains such as diamond, to increase the frequency of replacement of guide rollers. When a plurality of ingots are cut at a time as in the above method, the number of substrates formed by a single cutting step can be increased, and consumption of the abrasive fluid, guide rollers, etc. can be kept down.

The production method of the III-nitride substrate may be arranged as follows: abrasive grains contained in the abrasive fluid contain at least one material selected from diamond, silicon carbide, boron carbide, alumina, silicon nitride, aluminum nitride, and gallium nitride. Since these materials are harder than the III-nitride crystal, the III-nitride crystal can be suitably cut.

The production method of the III-nitride substrate may be arranged as follows: a concentration of abrasive grains in the abrasive fluid is set in the range of not less than 40 g nor more than 300 g per liter. When the concentration of the abrasive grains is not less than 40 g per liter, it is feasible to drastically reduce the crack occurrence rate and bowing of the substrate. If the concentration of the abrasive grains exceeds 300 g per liter, the abrasive grains will excessively attach to a mechanism for running the wire array and enter movable parts such as bearings to possibly cause a failure of the multi-wire saw. Therefore, the concentration of the abrasive grains is preferably not more than 300 g per liter.

The production method of the III-nitride substrate may be arranged as follows: an average grain size of abrasive grains contained in the abrasive fluid is set in the range of not less than 1 μm nor more than 15 μm. When the average grain size of the abrasive grains is not less than 1 μm, it is feasible to drastically reduce the bowing of the substrate. When the average grain size of the abrasive grains is not more than 15 μm, it is feasible to drastically keep down the depth of a mechanically damaged layer.

The production method of the III-nitride substrate may be arranged as follows: a feed speed during cutting the ingot is set in the range of not less than 0.4 mm nor more than 2.4 mm per hour. When the feed speed is not more than 2.4 mm per hour, it is feasible to drastically reduce the bowing of the substrate. If the feed speed is too small, it will affect the efficiency of production of the III-nitride substrate; therefore, the feed speed is preferably not less than 0.4 mm per hour.

The production method of the III-nitride substrate may be arranged as follows: the wire array is comprised of the wire having a diameter of not less than 0.12 mm nor more than 0.2 mm. Since the III-nitride crystal is not substantialized by any method other than the method of forming it by vapor phase epitaxy at present, it is difficult to form a long ingot thereof, when compared with the other semiconductor materials. Therefore, the kerf loss (cutting margin) during the cutting is preferably as small as possible. For example, the minimum kerf loss is about 300 μm in cutting the ingot by means of a general inner diameter saw. Therefore, when the diameter of the wire is set to not more than 0.2 mm so as to be smaller than the kerf loss, the number of substrates per ingot can be increased when compared with the case using the inner diameter saw. When the diameter of the wire is not less than 0.12 mm, it is feasible to drastically reduce the bowing of the substrate.

EFFECT OF THE INVENTION

The production method of the III-nitride substrate according to the present invention successfully reduces the rate of occurrence of cracks during cutting the ingot by means of the wire array.

BRIEF DESCRIPTION OF THE DRAWINGS

FIG. 5 is a table showing substrate percent defectives due to occurrence of cracks, with variation in an inclination angle of an extending direction of a wire to the (1-100) plane of ingots, in the range of 0° to 90°.

FIG. 6 is a table showing substrate bowing amounts and crack occurrence states, with variation in a concentration of abrasive grains in cutting of ingots, in the range of 50 ct (10 g) to 2000 ct (400 g) per liter.

FIG. 7 is a table showing substrate bowing amounts and depths of a mechanically damaged layer, with variation in an average grain size of abrasive grains in cutting of ingots, in the range of 0.5 μm to 30 μm.

FIG. 8 is a table showing substrate bowing amounts, with variation in a feed speed of ingots in cutting of ingots, in the range of 0.4 mm to 3 mm per hour.

FIG. 9 is a table showing substrate bowing amounts, kerf losses, and wire tensions according to wire diameters, with variation in the diameter of the wire used in cutting of ingots, in the range of 0.08 mm to 0.24 mm.

DESCRIPTION OF REFERENCE SYMBOLS 1 multi-wire saw; 3 ingots; 3a first orientation flats; 3b second orientation flats; 11 workpiece support; 12a to 12c guide rollers; 13 slurry nozzle; 21 wire array; 22 wire; 31 support members.

BEST MODE FOR CARRYING OUT THE INVENTION

An embodiment of the production method of the III-nitride substrate according to the present invention will be described below in detail with reference to the accompanying drawings. In the description of the drawings the same elements will be denoted by the same reference symbols, without redundant description.

Embodiment

Figure 1:
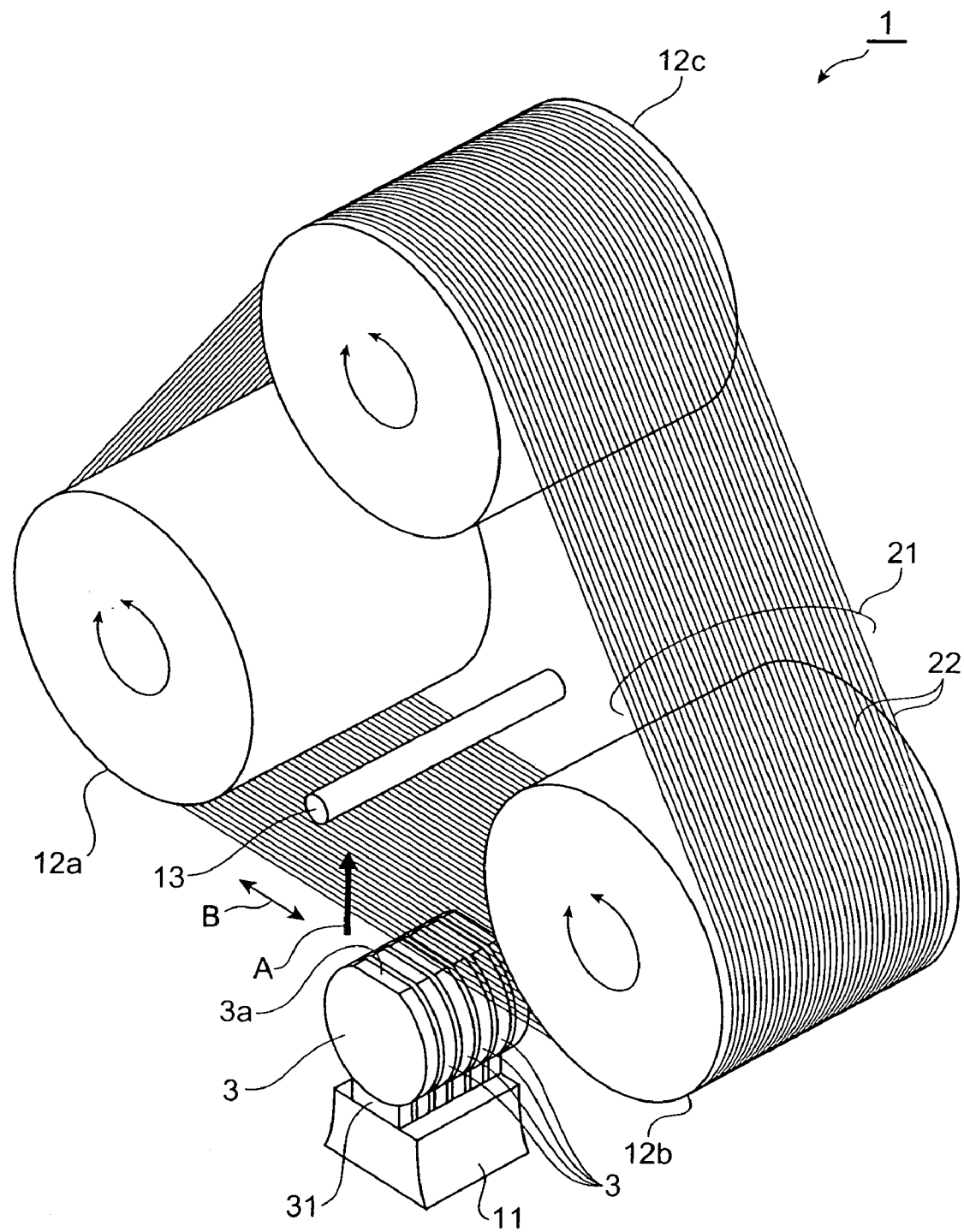
FIG. 1 is a perspective view showing a configuration of a multi-wire saw used in the production method of the III-nitride substrate according to the present embodiment.

FIG. 1 is a perspective view to show a configuration of a multi-wire saw 1 used in the production method of the III-nitride substrate according to the present embodiment. With reference to FIG. 1, the multi-wire saw 1 has a workpiece support 11, guide rollers 12a to 12c, a slurry nozzle 13, and a wire array 21. These components of the multi-wire saw 1 are supported each by an unrepresented housing.

The workpiece support 11 is a component for supporting one or more ingots 3 (a plurality of ingots in the present embodiment) being objects to be processed (workpieces). The workpiece support 11 may be, for example, one made of stainless steel. The workpiece support 11 is situated below the other components (guide rollers 12a to 12c, slurry nozzle 13, and wire array 21). A plurality of carbon support members 31 fixed to the respective ingots 3 are fixed on the workpiece support 11 and the plurality of ingots 3 are fixed through the respective support members 31 above the workpiece support 11. The workpiece support 11 is mounted on an unrepresented moving table and this moving table moves vertically upward to feed the ingots 3 vertically upward (in the direction of arrow A in the drawing).

The guide rollers 12a to 12c are rotating bodies of approximately cylindrical shape and are arranged so that directions of rotation axes of the respective rollers are perpendicular to the vertical direction (arrow A) and parallel to each other. The guide rollers 12a and 12b are arranged apart from each other on the left and right sides of a vertical line passing the workpiece support 11. The guide roller 12c is arranged above the guide rollers 12a and 12b and on the vertical line passing the workpiece support 11.

Peripheral surfaces of the guide rollers 12a to 12c are made, for example, of resin. A plurality of grooves are formed at equal intervals in the peripheral surfaces of the guide rollers 12a to 12c. A wire 22 is spirally wound in the plurality of grooves of the guide rollers 12a to 12c to form the wire array 21. The wire 22 runs back and forth in two directions with alternate repetitions of forward rotation and backward rotation of the guide rollers 12a to 12c. In the wire 22 wound around the guide rollers 12a to 12c, the part running on the lower end side of the guide rollers 12a and 12b runs at positions intersecting with the ingots 3 fed upward with movement of the workpiece support 11.

The slurry nozzle 13 is a slurry supplying means for spraying an abrasive fluid (slurry) in which loose abrasives are mixed in lapping oil, toward the wire 22 and ingots 3.

Figure 2:
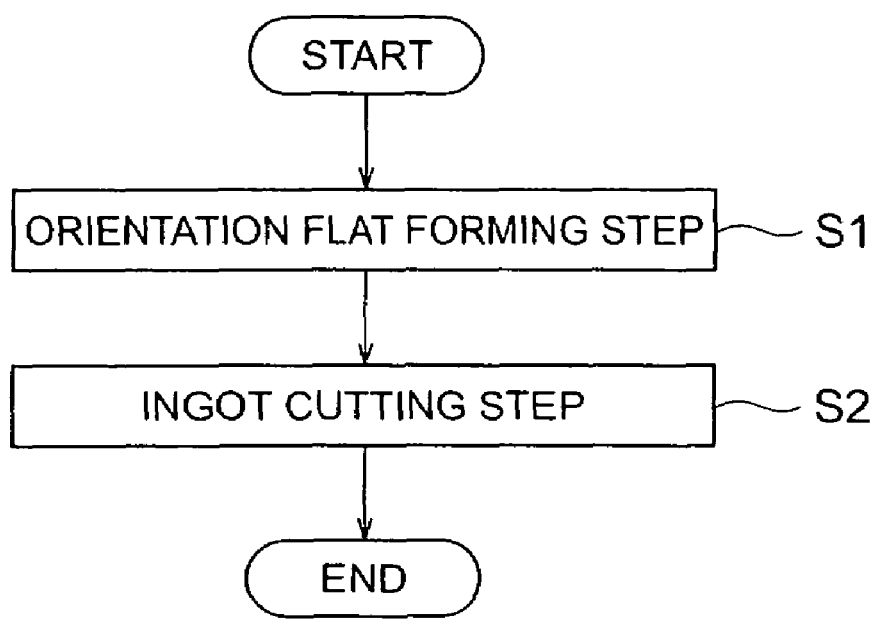
FIG. 2 is a flowchart showing the production method of the III-nitride substrate according to the present embodiment.

Subsequently, the production method of the III-nitride substrate according to the present embodiment will be described. The method described below can be suitably carried out by use of the above-described multi-wire saw 1. FIG. 2 is a flowchart showing the production method of the III-nitride substrate according to the present embodiment.

Figure 3:
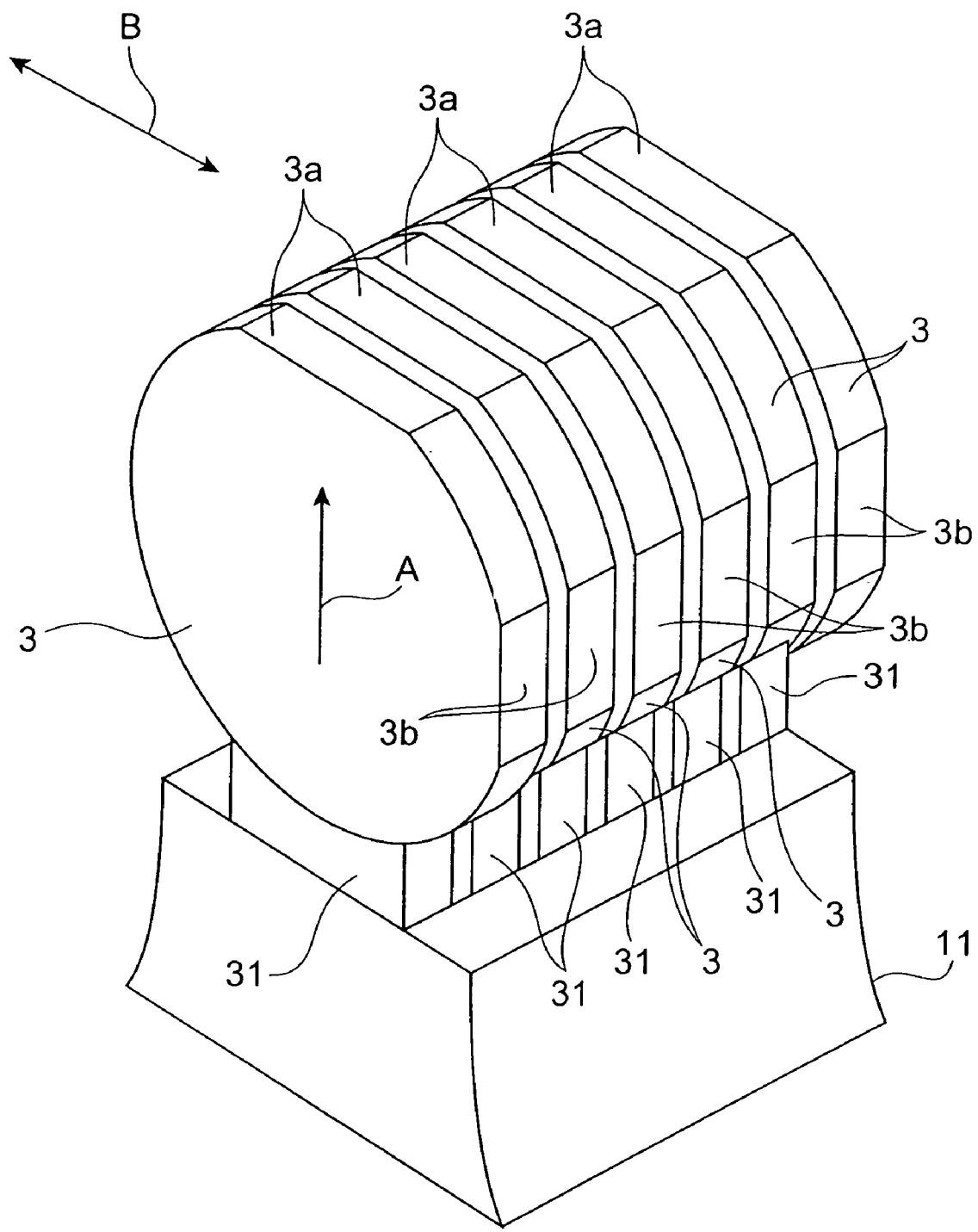
FIG. 3 is an enlarged perspective view of major part showing a state in which a plurality of ingots are mounted on a workpiece support.

The first step is to form a first orientation flat (OF) 3a indicating a direction of cleavage of each ingot 3, and a second OF 3b smaller than the first OF 3a, in the peripheral surface of each of the ingots 3 being objects to be processed (workpieces) (orientation flat forming step S1, cf. FIG. 2). Then the ingots 3 are attached to the workpiece support 11. FIG. 3 is an enlarged perspective view of major part showing a state in which the ingots 3 are attached to the workpiece support 11. In this step, as shown in FIG. 3, the ingots 3 are arranged alongside along the direction of the center axis thereof so as to face each other (or so as to contact each other), and are then attached to the workpiece support 11 so that the direction of the center axis is perpendicular to the vertical direction (feed direction A) and to the extending direction B of wire 22. At this time, the ingots 3 are attached so that the OFs 3a face the feed direction A (i.e., so that the OFs 3a are approximately perpendicular to the feed direction A).

The ingots 3 are crystal bulks made of a hexagonal III-nitride such as GaN, AlN, or InN. The ingots 3 of the present embodiment are formed in a disk shape having the principal surface (flat surface) of the {0001} plane (C plane). An example of dimensions of the ingots 3 is, for example, the outside diameter of about 50 mm and the thickness of about 5 mm.

Figure 4:
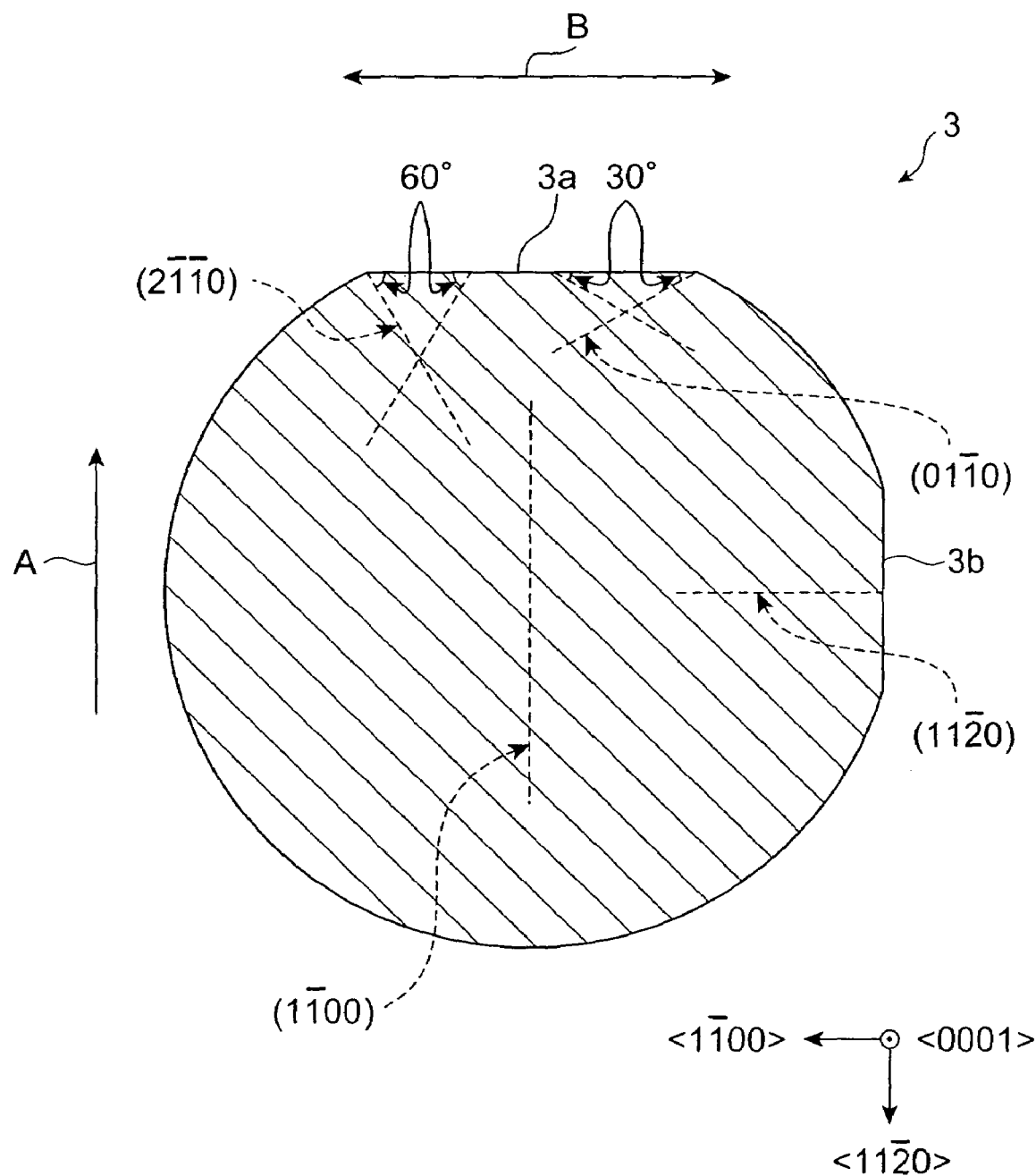
FIG. 4 is a sectional view showing a cross section of an ingot fixed on the workpiece support, perpendicular to a direction of a center axis thereof.

FIG. 4 is a sectional view showing a cross section of an ingot 3 fixed on the workpiece support 11, perpendicular to the center-axis direction of ingot 3. FIG. 4 shows directions of crystal axes of ingot 3 (<0001>, <1-100>, and <11-20>).

As described previously, the first OF 3a and second OF 3b described above are formed in the peripheral surface of ingot 3 in the present embodiment. As shown in FIG. 4, the first OF 3a is formed so as to be perpendicular to the <11-20> direction of ingot 3 (i.e., along the (11-20) plane of ingot 3). The second OF 3b is formed so as to be perpendicular to the <1-100> direction of ingot 3 (i.e., along the (1-100) plane of ingot 3).

In fixing each ingot 3 to the workpiece support 11, the ingot 3 is fixed so that the extending direction B of wire 22 is inclined at 3° or more to the {1-100} plane (M plane) of ingot 3. In the ingot 3 being the hexagonal III-nitride crystal, the (1-100) plane, and the (10-10) plane and (01-10) plane being equivalent planes thereto intersect at angles of 60° with each other, and are cleavage surfaces with high cleavage nature. In the present embodiment, the extending direction B of wire 22 is inclined at 3° or more from these planes. More preferably, the inclination angle of the extending direction B of wire 22 is set to not more than 27° to the first OF 3a ((1-100) plane). In the present embodiment, as shown in FIG. 4, the ingots 3 are fixed to the workpiece support 11 so that the extending direction B of wire 22 is parallel to the first OFs 3a (i.e., the angle between the extending direction B and the (1-100) plane is 0°). This makes the feed direction A of ingots 3 perpendicular to the first OFs 3a, whereby the cutting is started from the first OFs 3a.

Subsequently, the cutting of ingots 3 is started. The guide rollers 12a to 12c are rotated alternately forward and backward to start reciprocation of wire 22. Then the workpiece support 11 with ingots 3 thereon is moved upward to feed the ingots 3 toward the wire 22 (wire array 21). At this time, the slurry nozzle 13 starts to spray the abrasive fluid.

When the ingots 3 come into contact with the wire 22, the ingots 3 start to be cut by action of the abrasive fluid penetrating between the ingots 3 and the wire 22. Then the ingots 3 are fed at an approximately constant speed in the feed direction A with supply of the abrasive fluid. In this way the ingots 3 are cut into plates having the thickness according to the wire spacing of the wire array 21 (ingot cutting step S2, cf. FIG. 2).

During cutting the ingots 3 of the III-nitride crystals, the concentration of the abrasive grains in the abrasive fluid is preferably not less than 200 ct (40 g) nor more than 1500 ct (300 g) per liter. The average grain size of the abrasive grains in the abrasive fluid is preferably not less than 1 μm nor more than 15 μm. The feed speed of the ingots 3 is preferably not less than 0.4 mm nor more than 2.4 mm per hour. The diameter of the wire 22 used in the wire array 21 is preferably not less than 0.12 mm nor more than 0.2 mm.

The abrasive grains mixed in the abrasive fluid are preferably those containing at least one material selected from diamond, silicon carbide, boron carbide, alumina, silicon nitride, aluminum nitride, and gallium nitride.

After the ingots 3 are cut in this manner, the cut surfaces (principal surfaces and back surfaces) of the III-nitride crystals of plate shape thus cut out of the ingots 3 are polished to remove the mechanically damaged layer made in the cut surfaces, and to reduce the bowing. The III-nitride substrates are completed through the above steps.

The following will describe the effects provided by the production method of the III-nitride substrate according to the present embodiment. In the aforementioned production method of the III-nitride substrate, the ingots 3 are cut, while the extending direction B of the wire 22 is inclined at 3° or more to the {1-100} plane being the cleavage plane easiest to cleave in the III-nitride crystals.

FIG. 5 is a table showing the results of a first experiment conducted by the Inventor. FIG. 5 shows substrate percent defectives due to occurrence of cracks, with variation in the inclination angle of the extending direction B of the wire 22 to the (1-100) plane of ingots 3 in the range of 0° to 90°. The ingots 3 and cutting conditions thereof used in the present experiment are as follows.

Ingots: single crystals of GaN
Principal surface of ingots: (0001) plane
Outer shape of ingots: diameter 50.8 mm, thickness 5 mm
Material of abrasive grains: single-crystal diamond
Average grain size of abrasive grains: 6 μm
Concentration of abrasive grains in abrasive fluid: 1500 ct (300 g) per liter
Lubricant (lapping oil): mineral oil Feed speed: 1.6 mm per hour
Wire running speed: 600 m per minute
Wire diameter: 0.18 mm
Wire tension: 25 N As shown in FIG. 5, when the inclination angle of the extending direction B to the (1-100) plane is 0° (i.e., when the extending direction B is parallel to the (1-100) plane), the substrate percent defective due to occurrence of cracks is as high as 30%. In contrast to it, when the inclination angle of the extending direction B to the (1-100) plane is 3°, the substrate percent defective due to occurrence of cracks decreases by half to 15%.

When the inclination angle of the extending direction B to the (1-100) plane is 60° (i.e., when the extending direction B is parallel to the (10-10) plane or the (01-10) plane which is an equivalent plane to the (1-100) plane), the substrate percent defective due to occurrence of cracks becomes as high as 20%. In contrast to it, when the inclination angle of the extending direction B to the (1-100) plane is 57° or 63° (i.e., when the inclination angle of the extending direction B to the (10-10) plane or to the (01-10) plane is 3°), the substrate percent defective due to occurrence of cracks is significantly reduced to 12% or 15%.

When the inclination angle of the extending direction B to the {1-100} plane is larger than 3°, the substrate percent defective due to occurrence of cracks is low, 11% or less, at any inclination angle. By inclining the extending direction B of the wire 22 at 3° or more to the {1-100} plane of ingots 3 as described above, it is feasible to drastically decrease the crack occurrence rate of the III-nitride substrate. If the inclination angle of the extending direction B to the {1-100} plane is set to an angle smaller than 3°, the extending direction B will instantaneously become parallel to the (1-100) plane because of deflection of the wire 22 or the like in the cutting operation, so as to possibly increase the crack occurrence rate.

Preferably, prior to the cutting of ingots 3, the first OFs 3a are formed along the (11-20) plane of ingots 3 in the peripheral surfaces of the ingots 3 and during cutting the ingots 3, the inclination angle of the extending direction B of the wire 22 to the (11-20) plane of ingots 3 is set to 27° or less. Since the (11-20) plane of the III-nitride crystal is perpendicular to the (1-100) plane with high cleavage nature, it is suitable for the first OFs 3a. The (11-20) plane is inclined at 30° to the (10-10) plane and (01-10) plane being the equivalent planes to the (1-100) plane. Therefore, when the inclination angle of the extending direction B of the wire 22 to the (11-20) plane is not more than 27°, the extending direction B of the wire 22 is inclined at 3° or more to the {1-100} plane, whereby the crack occurrence rate can be drastically reduced.

When the inclination angle of the extending direction B of the wire 22 to the (11-20) plane of ingots 3 is set to not more than 27°, the following effects are further achieved. The III-nitride crystals are harder than the other semiconductor crystals such as Si and GaAs and the nitrogen surface and the III-atom surface (Ga surface in the case of GaN) opposite thereto are different in such properties as hardness and chemical resistance; therefore, the feed speed during cutting of the III-nitride crystals has to be lower than those of the other semiconductor crystals, and the cutting takes some time. When the inclination angle of the extending direction B to the (11-20) plane, i.e., to the first OFs 3a is not more than 27°, the cutting distance (the outside diameter of ingots 3 in the feed direction A) is decreased by virtue of the first OFs 3a, so as to reduce the time necessary for the cutting. When the ingots 3 are so arranged that the first OFs 3a are located on the cutting start side as in the present embodiment, the portions of ingots 3 at a start of cutting are not peripheral surfaces but planes, which facilitates alignment between the ingots 3 and the wire array 21.

The first OFs 3a in the present embodiment are formed along the (11-20) plane, but the second OFs 3b smaller than the first OFs 3a may be formed along the (11-20) plane. This also achieves the effects similar to the above.

The principal surface of ingots 3 is the (0001) plane in the present embodiment, but the same effects as above can also be achieved when ingots with the maximum off angle of 5° from the (0001) plane are sliced.

Preferably, a plurality of ingots 3 are arranged alongside in the direction intersecting with the feed direction A on the occasion of cutting the ingots 3 and the plurality of ingots 3 are cut at a time as in the present embodiment. The feed speed during cutting of the III-nitride crystals is lower than those of the other semiconductor crystals such as Si and GaAs, and the cutting takes some time. On the other hand, where the multi-wire saw is used in the cutting of ingots 3, it is necessary to use a generally expensive abrasive fluid (slurry) containing hard abrasive grains such as diamond, in order to cut the hard III-nitride crystals. In addition, the guide rollers 12a to 12c for running the wire 22 wear faster by virtue of the abrasive fluid containing the hard abrasive grains such as diamond, so as to raise the frequency of replacement of the guide rollers 12a to 12c. When the plurality of ingots 3 are cut at a time as in the present embodiment, the number of substrates formed by a single cutting step is increased, so as to hold down the consumption of the abrasive fluid necessary for the cutting of ingots 3 and the consumption of the guide rollers 12a to 12c and others.

The plurality of ingots 3 are arranged alongside on a line in the direction of the center axis thereof in the present embodiment, but the plurality of ingots 3 may also be arranged alongside along the direction perpendicular to the center-axis direction and to the feed direction A (i.e., along the extending direction B of the wire 22). When the plurality of ingots 3 are arranged in this manner, the plurality of ingots 3 can also be cut at a time and it is feasible to hold down the consumption of the abrasive fluid and the guide rollers 12a to 12c and others.

The ingots 3 are sliced alongside independently of each other in the present embodiment, but the ingots 3 may be bonded to each other and sliced in the elongated ingot form.

Preferably, the abrasive grains mixed in the abrasive fluid are preferably those containing at least one material selected from diamond, silicon carbide, boron carbide, alumina, silicon nitride, aluminum nitride, and gallium nitride as in the present embodiment. The abrasive grains to cut the III-nitride crystals such as GaN can be those having hardness equivalent to or higher than that of the III-nitride crystals. Examples of such abrasive materials include diamond, silicon carbide, boron carbide, and alumina. In addition to those, nitrides such as silicon nitride, aluminum nitride, and gallium nitride can also be used as abrasive materials. These materials all are materials harder than the III-nitride crystals and capable of suitably cutting the ingots 3. According to the Inventor's experiment, diamond is hardest among the above abrasive materials and has excellent cutting performance; therefore, diamond enabled cutting at higher feed speeds and demonstrated better working accuracy, e.g., less bowing of substrates than the other abrasive materials.

The concentration of the abrasive grains in the abrasive fluid is preferably not less than 40 g nor more than 300 g per liter, as described above. FIG. 6 is a table showing the results of a second experiment conducted by the Inventor. FIG. 6 shows substrate bowing amounts and crack occurrence states, with variation in the abrasive concentration during cutting of ingots 3 in the range of 50 ct (10 g) to 2000 ct (400 g) per liter. This experiment was carried out through the use of ingots 3 similar to those in the first experiment, with the relative angle of the extending direction B of the wire 22 to the (1-100) plane being 90°, and under the same cutting conditions except for the abrasive concentration as in the first experiment.

As shown in FIG. 6, when the abrasive concentration was 50 ct (10 g) per liter, the bowing of substrates was relatively large, 80 μm, and cracks were observed in some substrates. Saw marks were also observed in some of the substrates. In contrast to it, when the abrasive concentration was increased to 200 ct (40 g) or more per liter, the bowing of substrates was drastically reduced to not more than 50 μm and neither cracks nor saw marks were observed at all. If the bowing of a substrate exceeds 50 μm, the substrate must be polished by a too large thickness in polishing the substrate after cutting and the substrate will become easier to crack, for example, when mounted on a table in a subsequent step. It was found by this experiment that when the concentration of abrasive grains was not less than 200 ct (40 g) per liter, the rate of occurrence of cracks and saw marks and the bowing of substrates were reduced drastically and sufficiently.

It was also found that, as shown in FIG. 6, when the concentration of abrasive grains was 2000 ct (400 g) per liter, the abrasive grains excessively attached to the mechanism for running the wire 22, such as the guide rollers 12a to 12c, and entered the movable parts, such as bearings, so as to break the movable parts and cause a failure of multi-wire saw 1. In contrast to it, when the concentration of abrasive grains was not more than 1500 ct (300 g) per liter, these inconveniences did not occur. Therefore, the concentration of the abrasive grains in the abrasive fluid is preferably not more than 1500 ct (300 g) per liter.

As described above, the average grain size of the abrasive grains in the abrasive fluid is preferably not less than 1 μm nor more than 15 μm. FIG. 7 is a table showing the results of a third experiment conducted by the Inventor. FIG. 7 shows substrate bowing amounts and depths of a mechanically damaged layer, with variation in the average grain size of the abrasive grains during cutting of ingots 3 in the range of 0.5 μm to 30 μm. This experiment was carried out through the use of ingots 3 similar to those in the first experiment, with the relative angle of the extending direction B of the wire 22 to the (1-100) plane being 90°, and under the same cutting conditions except for the average grain size of the abrasive grains as in the first experiment.

As shown in FIG. 7, when the average grain size of the abrasive grains was 0.5 μm, the bowing of substrates was relatively large, 60 μm. In contrast to it, when the average grain size of the abrasive grains was not less than 1 μm, the bowing of substrates was drastically reduced to not more than 50 μm. It was thus found that when the average grain size of the abrasive grains was not less than 1 μm, the bowing of substrates was reduced drastically and sufficiently.

As shown in FIG. 7, when the average grain size of the abrasive grains was not less than 20 μm, the depth of the mechanically damaged layer became relatively large, 12 μm or more, and microcracks were observed. According to the Inventor's knowledge, if the depth of the mechanically damaged layer exceeds 10 μm, the substrate must be polished by a too large thickness in polishing the substrate after cutting and will become easier to induce microcracks inside the crystal of the substrate. In contrast to it, when the average grain size of the abrasive grains was not more than 15 μm, the depth of the mechanically damaged layer was drastically and sufficiently reduced to not more than 6 μm and no microcracks were observed. Therefore, the average grain size of the abrasive grains is preferably not more than 15 μm.

As described above, the feed speed of ingots 3 during cutting of ingots 3 is preferably not less than 0.4 mm nor more than 2.4 mm per hour. FIG. 8 is a table showing the results of a fourth experiment conducted by the Inventor. FIG. 8 shows substrate bowing amounts, with variation in the feed speed of ingots 3 during cutting of ingots 3 in the range of 0.4 mm to 3 mm per hour. This experiment was carried out through the use of ingots 3 similar to those in the first experiment, with the relative angle of the extending direction B of the wire 22 to the (1-100) plane being 90°, and under the same cutting conditions except for the feed speed as in the first experiment.

As shown in FIG. 8, when the feed speed of ingots 3 was 3 mm, the bowing of substrates was relatively large, 75 μm. In contrast to it, when the feed speed of ingots 3 was not more than 2.4 mm, the bowing of substrates was drastically reduced to not more than 50 μm. It was thus found that when the feed speed of ingots 3 was not more than 2.4 mm, the bowing of substrates was drastically and sufficiently reduced. A too small feed speed of ingots 3 will adversely affect the production efficiency of substrates. It was confirmed by this experiment that the bowing of substrates was reduced when the feed speed of ingots 3 was not less than 0.4 mm nor more than 2.4 mm per hour.

The bowing of GaN substrates in cutting the ingots 3 is considered to arise from the fact that the principal surface and back surface of GaN have different polarities, different from GaAs, Si, sapphire, or the like, and that there is a difference of hardness between the two surfaces. The feed speed of ingots 3 is kept constant in the present embodiment, but, particularly, in the case of cylindrical ingots, the feed speed of ingots 3 may be varied so as to keep the cutting load constant.

As described above, the diameter of the wire 22 used in the wire array 21 is preferably not less than 0.12 mm nor more than 0.2 mm. FIG. 9 is a table showing the results of a fifth experiment conducted by the Inventor. FIG. 9 shows substrate bowing amounts, kerf losses (cutting margins), and wire tensions according to wire diameters, with variation in the diameter of the wire 22 used in cutting of ingots 3, in the range of 0.08 mm to 0.24 mm. This experiment was carried out through the use of ingots 3 similar to those in the first experiment, with the relative angle of the extending direction B of the wire 22 to the (1-100) plane being 90°, and under the same cutting conditions except for the wire diameter as in the first experiment.

As shown in FIG. 9, when the diameter of the wire 22 was 0.08 mm, the bowing of substrates was relatively large, 75 μm. In contrast to it, when the diameter of the wire 22 was not less than 0.12 mm, the bowing of substrates was drastically reduced to not more than 45 μm. It was thus found that when the diameter of the wire 22 was not less than 0.12 mm, the bowing of substrates was reduced drastically and sufficiently.

As shown in FIG. 9, when the diameter of the wire 22 was 0.24 mm, the kerf loss was relatively large, 320 μm. Since the III-nitride crystals have not been realized by any method other than the method of forming them by vapor phase epitaxy at present, it is difficult to form a long ingot, when compared with the other semiconductor materials. Therefore, the kerf loss in the cutting is preferably kept as small as possible, so as to maximize the number of substrates cut out of one ingot. In the present experiment, the kerf loss was not more than 280 μm when the diameter of the wire 22 was not more than 0.20 mm. Since the minimum kerf loss was about 300 μm in cutting of ingots with the use of an inner diameter saw popularly used, the number of substrates per ingot is greater where the diameter of the wire 22 is not more than 0.20 mm than where the inner diameter saw is used.

The production method of the III-nitride substrate according to the present invention is not limited to the above embodiment, but can be modified in various ways. For example, the above embodiment exemplified the bulk of cylindrical shape as an ingot, but the ingot may be of any other shape such as the prismatic shape. The above embodiment exemplified the so-called upper cut method to feed the ingots from bottom to the wire, but the present invention can also be applied to the so-called down cut method to feed the ingots from top to the wire. The above embodiment exemplified the method of moving the ingots, but it is also possible to adopt a method of moving the wire toward the ingots.

The above embodiment showed the example where the attitude angle of the ingots to the wire was fixed, but the cutting may be carried out while swinging the ingots or the guide rollers in directions within the cutting surface. In this case, the ingots should preferably be swung in an angular range in which the angle of the {11-20} plane of ingots to the extending direction of the wire can be maintained at 3° or more.

The invention claimed is:

1. A method of producing a III-nitride substrate by cutting an ingot of a hexagonal III-nitride crystal, using a wire array, comprising:

a step of cutting the ingot with supply of an abrasive fluid, while feeding at least one of the ingot and the wire array in a direction intersecting with an extending direction of a wire in the wire array, wherein during cutting the ingot, the extending direction of the wire in the wire array is inclined at 3° or more to the {1-100} plane of the ingot and is set parallel to the {0001} plane of the ingot, and a down cut method to feed the ingot from top to the wire array is used.

2. A method of producing a III-nitride substrate by cutting an ingot of a hexagonal III-nitride crystal, using a wire array, comprising:

a step of cutting the ingot with supply of an abrasive fluid, while feeding at least one of the ingot and the wire array in a direction intersecting with an extending direction of a wire in the wire array, wherein during cutting the ingot, the extending direction of the wire in the wire array is inclined at 3° or more to the {1-100} plane of the ingot and is set parallel to the {0001} plane of the ingot, and either one of the ingot and guide rollers is swung.

3. A method of producing a III-nitride substrate by cutting an ingot of a hexagonal III-nitride crystal, using a wire array, comprising:

a step of cutting the ingot with supply of an abrasive fluid, while feeding at least one of the ingot and the wire array in a direction intersecting with an extending direction of a wire in the wire array, wherein during cutting the ingot, the extending direction of the wire in the wire array is inclined at 3° or more to the {1-100} plane of the ingot and is set parallel to the {0001} plane of the ingot, and tension of the wire is set from 12N to 30N.

* * * * *